(12) United States Patent
Dickey et al.

(10) Patent No.: US 9,133,546 B1
(45) Date of Patent: Sep. 15, 2015

(54) ELECTRICALLY- AND CHEMICALLY-ACTIVE ADLAYERS FOR PLASMA ELECTRODES

(71) Applicants: Eric R. Dickey, Portland, OR (US); Bryan Larson Danforth, Portland, OR (US); Masato Kon, Sugito-cho (JP)

(72) Inventors: Eric R. Dickey, Portland, OR (US); Bryan Larson Danforth, Portland, OR (US); Masato Kon, Sugito-cho (JP)

(73) Assignee: LOTUS APPLIED TECHNOLOGY, LLC, Hillsboro, OR (US)

( * ) Notice: Subject to any disclaimer, the term of this patent is extended or adjusted under 35 U.S.C. 154(b) by 11 days.

(21) Appl. No.: 14/198,429

(22) Filed: Mar. 5, 2014

(51) Int. Cl.
*H05H 1/00* (2006.01)
*C23C 16/00* (2006.01)
*H01L 21/44* (2006.01)
*C23C 16/455* (2006.01)
*C23C 16/50* (2006.01)
*H01J 37/32* (2006.01)

(52) U.S. Cl.
CPC ............ *C23C 16/45544* (2013.01); *C23C 16/50* (2013.01); *H01J 37/32009* (2013.01)

(58) Field of Classification Search
USPC ............... 438/478–509, 597–688; 427/248.1, 427/539, 569, 575; 118/718, 719, 723 R
See application file for complete search history.

(56) References Cited

U.S. PATENT DOCUMENTS

| | | | |
|---|---|---|---|
| 4,328,258 A | 5/1982 | Coleman | |
| 4,528,084 A | 7/1985 | Beer et al. | |
| 5,385,761 A | 1/1995 | Iwanaga | |
| 6,768,079 B2 | 7/2004 | Kosakai | |
| 7,281,491 B2 | 10/2007 | Iwamaru | |
| 7,309,471 B2 | 12/2007 | Benje et al. | |
| 7,405,521 B2 | 7/2008 | Dhindsa et al. | |
| 8,075,690 B2 | 12/2011 | Keller et al. | |
| 8,207,470 B2 | 6/2012 | Jeon et al. | |
| 2002/0007792 A1 | 1/2002 | Siegrist | |
| 2006/0091005 A1 | 5/2006 | Toma et al. | |
| 2007/0224348 A1 | 9/2007 | Dickey et al. | |
| 2009/0200267 A1 | 8/2009 | Shim et al. | |
| 2010/0124621 A1 | 5/2010 | Kobayashi et al. | |
| 2011/0024048 A1* | 2/2011 | Nakamura et al. | 156/345.51 |
| 2011/0139751 A1 | 6/2011 | Koo et al. | |

(Continued)

FOREIGN PATENT DOCUMENTS

| | | |
|---|---|---|
| JP | 9-17367 A | 1/1997 |
| JP | 10-180098 A | 7/1998 |
| JP | 11-181570 A | 7/1999 |

(Continued)

OTHER PUBLICATIONS

E. Stoffels, et al., Negative ions in a radio-frequency oxygen plasma, Physical Review E, Mar. 1995, vol. 51, No. 3, The American Physical Society 1995.

P.C.S. Hayfield, Development of the Noble Metal/Oxide Coated Titanium Electrode, Part I: The Beginning of the Story, Platinum Metals Review, 1998, vol. 42, No. 1, pp. 27-33.

(Continued)

*Primary Examiner* — Karen Kusumakar
(74) *Attorney, Agent, or Firm* — Stoel Rives LLP (57) ABSTRACT

A system for forming a thin film on a substrate uses a plasma to activate at least one gaseous precursor in a plasma generator fluidly coupled with a reaction space. The plasma generator is operative to generate a plasma from at least a portion of the precursor gas with at least one pair of plasma electrodes, one plasma electrode having a non-native electrically conductive adlayer exhibiting property characteristics that cause the adlayer to be substantially conserved and chemically active with at least one of the gases present within the plasma generation region.

29 Claims, 8 Drawing Sheets

(56) References Cited

U.S. PATENT DOCUMENTS

| | | | |
|---|---|---|---|
| 2011/0159204 A1* | 6/2011 | Dickey et al. | ................ 427/539 |
| 2012/0021252 A1 | 1/2012 | Lee | |

FOREIGN PATENT DOCUMENTS

| | | | |
|---|---|---|---|
| JP | 2000-126546 A | 5/2000 | |
| WO | WO-2010/138103 A1 | 12/2010 | |
| WO | WO-2013/099570 A1 | 7/2013 | |

OTHER PUBLICATIONS

P.C.S. Hayfield, Development of the Noble Metal/Oxide Coated Titanium Electrode, Part II: The Move from Platinum/Iridium to Ruthenium Oxide Electrocatalysts, Platinum Metals Review, 1998, vol. 42, No. 2, pp. 46-55.

Korean Intellectual Property Office, "International Search Report," International Patent Application No. PCT/US2015/018289, mailed May 28, 2015, 6 pages.

Korean Intellectual Property Office, "Written Opinion of the International Searching Authority," International Patent Application No. PCT/US2015/018289, mailed May 28, 2015, 10 pages.

* cited by examiner

ELECTRICALLY- AND CHEMICALLY-ACTIVE ADLAYERS FOR PLASMA ELECTRODES

BACKGROUND

Plasma energy is sometimes used to facilitate or activate chemical reactions for thin film deposition. When applied to a gaseous precursor, plasma energy can generate neutral radicals and/or ions, transforming the more stable precursor into an activated species. The energetic activation barrier for a subsequent film forming reaction of the activated species would be expected to be lower than for the precursor. In turn, the deposition reaction should proceed with little need for thermal energy. Eliminating thermal reactions can be advantageous when the reaction temperature can activate undesired alternative reaction paths or alter the mechanical or physical properties of the substrate or other materials formed thereon.

Mass transfer limitations that can cause surface thickness non-uniformity are typically absent in kinetically-limited chemical vapor deposition (CVD) processes (e.g., some atomic layer deposition (ALD) processes). In an ALD process, a substrate is sequentially exposed to different precursor compounds, or precursors. These precursors chemically adsorb, or chemisorb, via chemical reaction with the substrate surface, to form metastable chemisorbed species. Subsequent exposure of these species to a different precursor leads to a surface reaction causing that precursor to become chemisorbed to the surface and incorporated therein, building up the film. In between exposures, non-chemisorbed amounts of the precursors are removed from the surface of the substrate (e.g., by evacuation and/or displacement via purging with a non-reactive gas) so that no more than chemisorbed amounts of one particular precursor is present on the surface during exposure to another precursor. This layer-by-layer exposure creates highly uniform films.

For example, some metal oxide ALD processes use organometallic compounds that may suffer from unwanted decomposition reactions when exposed to elevated temperatures. The metal atoms in these compounds are often stabilized with ligands bound to the metal atom which are broken upon adsorption of the precursor molecule to the surface.

In thermal ALD, surface energy activates all of the bond breaking and forming reactions during chemisorption for all of the precursors used to form the film. Because it is often problematic to vary the substrate temperature between subsequent exposure steps, it can be challenging to find a combination of precursors that will thermally decompose to form chemisorbed species stable enough to remain on the surface and active enough to remain reactive. That is, if the first precursor is too surface-stable, it may block chemisorption and/or reaction of the second precursor; if it is not stable enough, it may decompose.

In plasma enhanced ALD, the plasma supplies the energy to form a reactive intermediate. This intermediate can then react with a chemisorbed precursor to form a layer of film. While offering some advantages relative to thermal ALD, plasma ALD can be problematic, as the identity and concentration of reactive species formed within the plasma can be difficult to control. This can affect the chemical composition and/or the performance properties of the deposited layers.

DETAILED DESCRIPTION OF PREFERRED EMBODIMENTS

Figure 1:
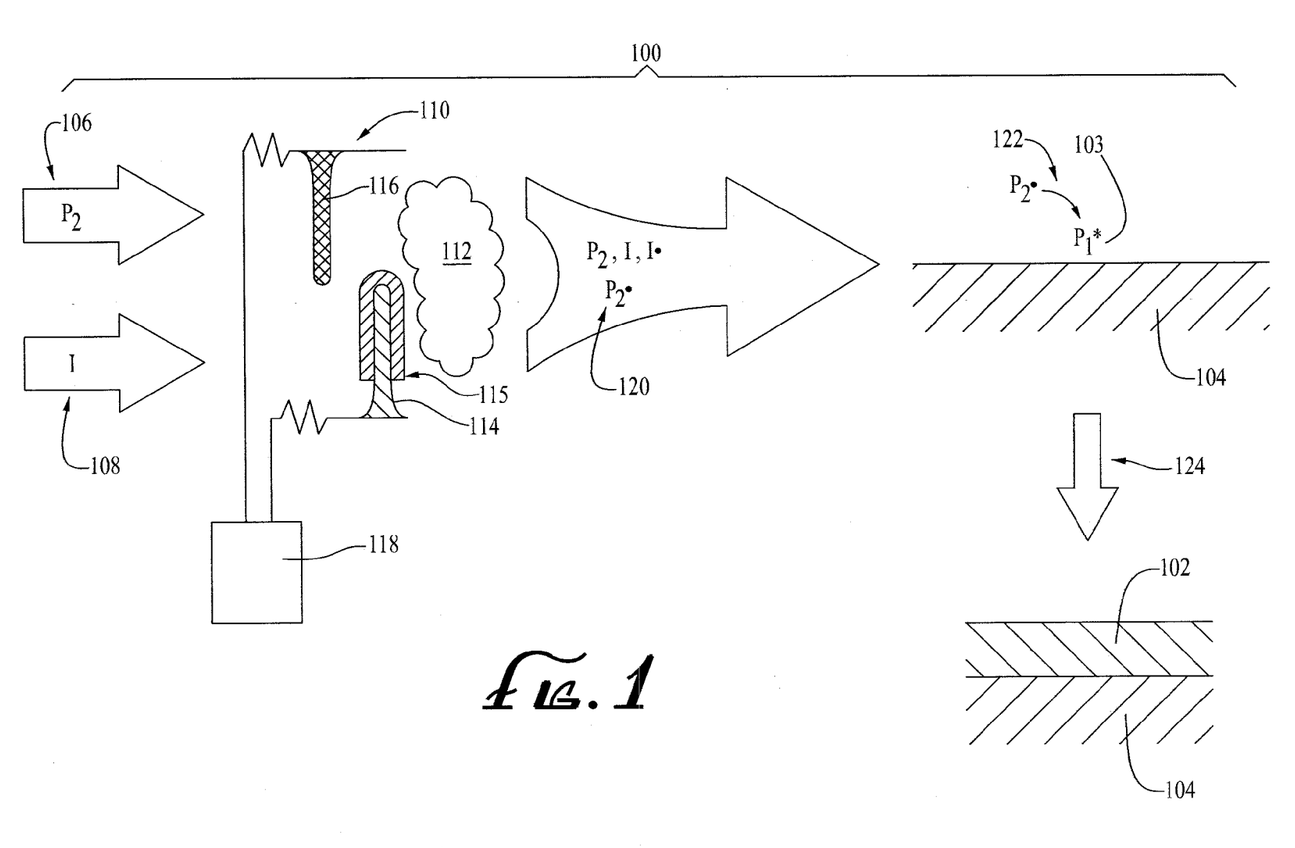
FIG. 1 is a schematic view of an embodiment of a method of forming a thin film.

FIG. 1 is a schematic view of an embodiment of a chemical vapor deposition (CVD) process 100 of forming a thin film 102 from two precursors, $P_1$ and $P_2$. In some embodiments, process 100 may occur via atomic layer deposition (ALD). In FIG. 1, thin film 102 is formed by a reaction between a chemisorbed amount of a first precursor 103 (shown in a chemisorbed state as indicated by an asterisk, $P_1^*$) on substrate 104 and radicals formed by plasma activation of a second precursor 106 (shown in a radical form as indicated by a dot, e.g., $P_2 \cdot$) that is chemically sensitive with $P_1^*$. In the embodiment shown in FIG. 1, a process gas including $P_2$ and an optional diluent gas 108 (labeled I) mixed therewith is provided to a plasma generator 110 to generate a plasma 112. In the context of substrate deposition and processing, process gases refer to those gases to which substrate 104 is exposed before, during, and after thin film deposition. In the embodiment shown in FIG. 1, process gases include first precursor gas 103, second precursor gas 106, and diluent gas 108. Diluent gas 108 is essentially non-reactive or inert with either precursor. In the embodiment shown in FIG. 1, second precursor gas 106 and diluent gas 108 are both plasma sensitive process gases that may be ionized by a plasma generation field to form plasma 112. Example plasma sensitive process gases include, but are not limited to, argon (Ar), helium (He), oxygen ($O_2$), carbon dioxide ($CO_2$), carbon monoxide (CO), nitrogen ($N_2$), nitrogen monoxide (NO), nitrous oxide ($N_2O$), ammonia ($NH_3$), and nitrogen dioxide ($NO_2$).

During use, plasma generator 110 activates gas molecules by applying an electric, magnetic, microwave, and/or radio frequency field to ionize at least some of the process gas, generating plasma 112. Activation of the process gas by the field creates free electrons within plasma 112 which are accelerated by the field. When these electrons collide with a precursor or diluent gas molecule, they may activate the molecule to generate various excited and/or ground state radicals, ions, and other species within plasma 112.

As shown in FIG. 1, plasma generator 110 includes at least one pair of electrically conductive electrodes (shown at 114 and 116) that act as plasma generation surfaces by creating the discharge that activates the mixture of precursor and optional diluent gases. The electrically conductive electrodes are electrically insulated or isolated from one another and have different electrical potentials with respect to one another during operation to create a plasma discharge within a plasma generation region where plasma 112 is ignited and sustained. In some embodiments, one electrode may act as a cathode (e.g., plasma generation surface 114) that supplies electrons to the plasma, while the other may act as an anode (e.g., plasma generation surface 116) that drains electrons from the plasma. In some embodiments electrodes 114, 116 may include standalone electrode elements. For example, embodiments of the cathodes and anodes disclosed herein may be included on respective detachably mounted cathode and anode elements. In some embodiments electrodes 114, 116 may be included on another structure proximal to the plasma generation region. For example, a reaction vessel wall and/or a dark space shield may act as an anode relative to a cathode that is electrically insulated from the vessel wall and/or dark space shield. In some embodiments, one of the pair of electrodes need not be exposed to the gases in the plasma generation region. For example, an antenna proximal to the plasma generation region but separated therefrom by an insulating material (e.g., quartz) may act as an electrode.

Electrodes 114 and 116 are shown electrically coupled to a plasma controller 118 in the embodiment shown in FIG. 1. Plasma controller 118 controls the distribution of electrical power from a power supply to electrodes 114 and 116. In some embodiments, plasma controller 118 may control power supplied to electrodes 114 and 116 so that both electrodes "float" and exhibit electrical potentials different than an earth potential. In some embodiments, plasma controller 118 may control power supplied to one of electrodes 114 or 116 while the other of electrodes 114 or 116 is earthed.

Primarily plasma 112 is formed in an area where a field is applied by plasma generator 110 when a plasma sensitive process gas is supplied. In some embodiments, the total and/or partial gas pressure may affect the shape, density, and size of plasma 112. In some embodiments, the process gas may be held at a low pressure during plasma generation. For example, total gas pressure in a processing zone containing plasma generator 110 may be between about 0.1 Torr and 5 Torr, or in some other embodiments, between about 1.2 Torr and about 2 Torr, or in still other embodiments, 0.5 Torr or less. Thus, the size, shape, and position of plasma 112 as shown in FIG. 1 are shown caricatured for purposes of illustration. Generally, a plasma region enveloping the electrical, magnetic, and/or radio frequency discharge of electrodes 114 and 116, and thus containing plasma 112, is positioned in the vicinity of a complementary pair of electrodes.

In the embodiment shown in FIG. 1, substrate 104 is exposed, at step 120, to a mixture of radicals and stable precursor and diluent gases. The lifetime for some radicals formed in plasma 112 may be different from, and in some cases greater than, a lifetime for the free electrons and ions present in plasma 112. Some radicals generated in plasma 112 may be transported out of plasma 112 via a gas stream, which is referred to herein as remote or indirect plasma generation of radicals.

At least some of the radicals formed from second precursor 106 ($P_2$.) react (shown at step 122) with the chemisorbed first precursor 103 ($P_1$*). Given a sufficiently long exposure to $P_2$., eventually a majority of the chemisorbed first precursor 103 present on substrate 104 reacts (as indicated at 124), to form thin film 102.

Electrode 114 includes, on a surface exposed to the plasma generation environment, a chemically active adlayer 115, shown in FIG. 1 with a thickness greatly exaggerated for clarity. Adlayer 115 exhibits surface property characteristics that cause the electrode surface to be chemically active with at least one of the gases present within the plasma generation region. For example, adlayer 115 is substantially conserved while exposed to plasma 112. That is, a majority, and in some embodiments, nearly all, of the amount of adlayer 115 present on electrode 114 before plasma ignition remains on the surface during plasma operation. In some embodiments, a service life for chemically active adlayer 115, or a time during which adlayer 115 chemically active with at least one of the gases present within the plasma generation region (which may be substantially the same as a service life for electrode 114 in some embodiments), may have a duration of about an hour. In some other embodiments, an adlayer service life may have a duration of between an hour and 10 hours; or between 10 and 100 hours; or 100 and 1000 hours; or more than 1000 hours.

Because adlayer 115 is substantially conserved on electrode 114 (e.g., preferably), the chemically active adlayer is not expected to be removed via ion sputtering during plasma processing by more than an incidental amount. Nevertheless, it is anticipated that a small amount of adlayer 115 may be sacrificed over the life of electrode 114. These losses are expected to be minor, but may still be detectable as contaminants in the deposited films. In some embodiments, small amounts of optional, sacrificial dopant elements may be included along with the chemically active material. It is not believed that the dopants will contribute, at a substantial level, to the chemical activity of the surface, as the dopants are expected to be preferentially removed from the surface. In some of such embodiments, adlayer 115 may include, in an amount of about 15% or less, a p-type dopant such as one or more of fluorine (F), antimony (Sb), or aluminum (Al), or in some embodiments consisting essentially of F, Sb, or Al.

In some embodiments, adlayer 115 may include a material that is catalytically active with respect to a precursor gas present in the plasma generator during operation. Generally, a material is catalytically active for a chemical reaction if the material accelerates the rate of the reaction without being substantially consumed by the reaction. Non-limiting examples of catalytic materials include some transition metals, including one or more of palladium (Pd), platinum (Pt), cobalt (Co), iridium (Ir), or nickel (Ni), or in some embodiments consisting essentially of Pd, Pt, Co, Ir, or Ni, though catalytically active materials are not limited to metals.

However, though adlayer 115 is substantially conserved and chemically active, in some embodiments it need not behave catalytically. In some embodiments, adlayer 115 may include a material stabilized, during plasma generation, into an electrically conductive state with which one or more gases present in the plasma may be chemically active. For example, an oxygen plasma may be chemically active with an electrically conductive metal oxide or a mixture of metal oxides or included in forming the adlayer. One non-limiting example adlayer 115 includes a mixture of indium and tin oxides (e.g., ITO) stabilized in a partially reduced state during plasma operation. Another non-limiting example adlayer 115 consists essentially of $(In_2O_3)_{1-x}(SnO)_x$ stabilized under plasma conditions.

Figure 2:
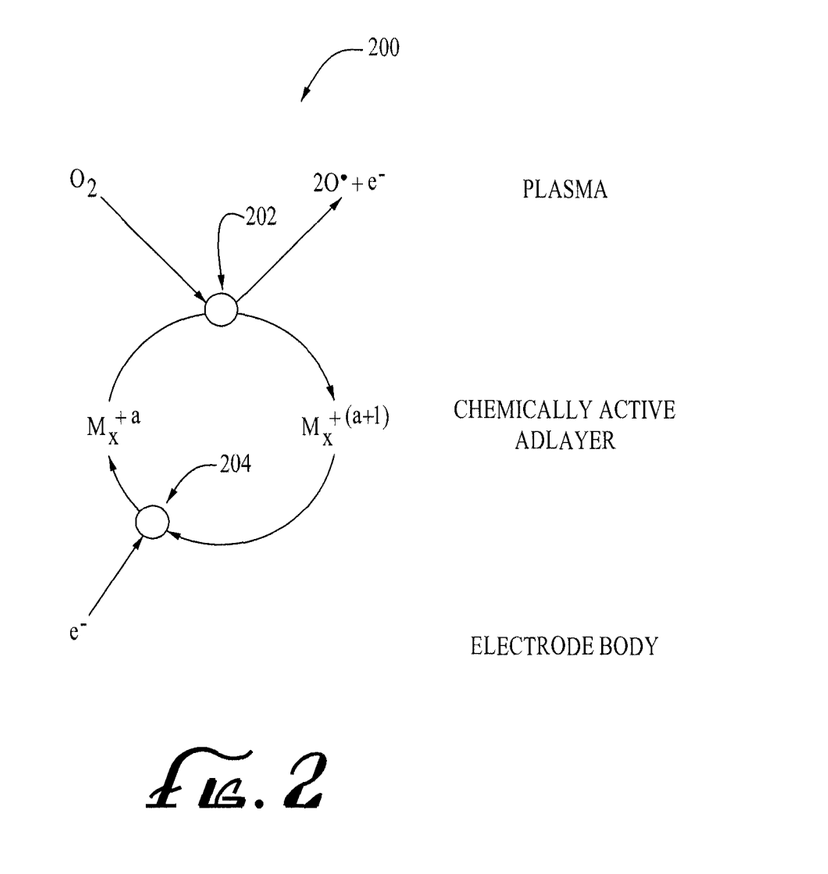
FIG. 2 is a model reaction scheme illustrating chemical activity between a precursor gas and a chemically active electrode surface according to an embodiment of the present disclosure.

FIG. 2 is an embodiment of a reaction model 200 illustrating chemical activity 202 between an oxygen ($O_2$) precursor gas and a metal ($M_x$) included in a cathode surface (e.g., adlayer 115 shown in FIG. 1 used as a cathode), and electron transport 204 within the electrode surface, as described in more detail below. FIG. 2 is merely a simplified schematic model and is not meant to illustrate the exact mechanism of any particular reaction scheme. Generally, as shown in FIG. 2, two stable oxygen radicals (O.) are formed along with an electron (e⁻), though it will be appreciated that a variety of oxygen ions and excited and/or ground state radicals may also be formed at the electrode surface within the highly energetic plasma environment.

In some embodiments, the chemically active adlayer may be capable of catalytically transforming some of the second precursor gas into radicals. Applying reaction scheme 200 to such embodiments, $M_x$ catalytically cycles between oxidation states to dissociate oxygen gas adsorbed to the electrode surface, forming oxygen radicals. At step 202, $O_2$ chemisorbs to the metal and temporarily oxidizes it, as the pair of electrons in an oxygen atom might oxidize platinum (Pt) from $Pt^{+2}$ to $Pt^{+4}$. Electrons supplied to the electrode surface material by the plasma power source reduce the metal at step 204, releasing the oxygen radicals and the electron as shown at step 202 in FIG. 2.

A surface that is chemically active and substantially conserved during plasma generation need not be limited to catalyst materials or to materials exhibiting catalytic activity. In some embodiments, the electrode surface may be chemically active with one of the gases in the plasma environment as a consequence of the electrical environment created by the plasma and/or plasma generation. Some partially reduced metal oxides (that is, a suboxide of the metal) are believed to be stabilized under some plasma generation conditions. For example, indium-tin-oxide (ITO, or $(In_2O_3)_{1-x}(SnO_2)_x$) is believed to be reduced to $(In_2O_3)_{1-x}(SnO)_x$ in the presence of the radio frequency used in some capacitively coupled plasmas. In turn, plasma generated radicals may maintain and/or promote the electrical conductivity of the electrode.

Applying model reaction scheme 200 to such embodiments, a metal cation $M_x$ within a metal oxide held in a partially reduced state (in this example, $M_x^{+a}$) may become temporarily oxidized into an oxidation state $M_x^{+(a+1)}$ by adsorption of an oxygen atom to the electrode surface at step 202. Electrons believed to be traveling through oxygen vacancies within the partially reduced metal oxide lattice may cause metal-oxygen bonds to break at step 204. The oxygen atoms freed may leave the surface as oxygen radicals and/or ions. Naturally, steps 202 and 204 may happen concurrently, so that the oxidation of one metal atom is balanced or nearly balanced by the reduction of a different metal atom elsewhere in the partially reduced metal oxide material.

Regardless of whether the chemical activity occurs catalytically or not, the concentration of metastable radicals formed from the precursor gases exposed to the plasma is believed to be altered by the chemically active adlayer, which is expected to affect the throughput rate for substrate 104 through the reaction space or vessel.

Figure 3:
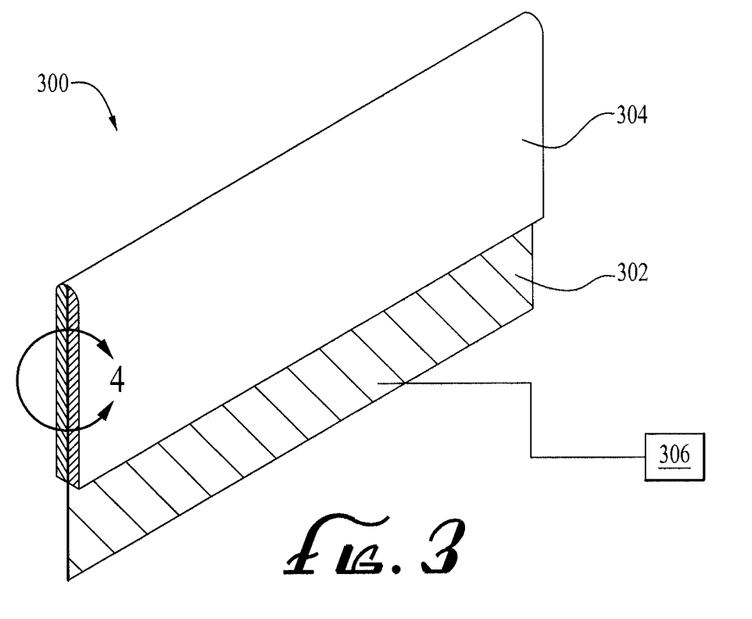
FIG. 3 is a fragmentary perspective view of an embodiment of an electrode.

FIG. 3 is a fragmentary perspective view of an embodiment of an electrode 300. Electrode 300 includes an electrode body 302 that extends into or faces into a plasma generation region when installed in a plasma generator. Electrode body 302 is typically formed from electrically conductive material, like a metal. In some examples, electrode emissive material may be located on a support (which may be conductive or nonconductive) (not shown) to provide mechanical strength. The embodiment illustrated in FIG. 3 is a simple electrode fin that is electrically coupled to a power supply included in a plasma controller 306. In some embodiments, electrode body 302 may be made from one or more of aluminum (Al) or copper (Cu). In some embodiments, coating a readily oxidized metal like Al or Cu with another metal may protect the underlying electrode from corrosion. In some embodiments, an emissive electrode body 302 including Al and/or Cu may be coated with one or more of Pd, Pt, Co, Ir, Ni, or ITO.

In the embodiment shown in FIG. 3, chemically active adlayer 304, with a thickness greatly exaggerated for clarity, forms a contiguous layer or coating over a portion of electrode body 302. In some embodiments, adlayer 304 may be present on electrode body 302 in an amount sufficient to be present on a majority of the portion of electrode body 302 active for generating a plasma (e.g., on a majority of an electrode exposed to a plasma generation region) throughout its service life. In some embodiments, adlayer 304 may be present on electrode body 302 in a thickness range of between about 5 nanometers (nm) to 500 nm depending on the type of adlayer material. In some embodiments, adlayer 304 may be present on electrode body 302 in spaced apart islands or domains. In some embodiments, adlayer 304 may alloy with an outer surface of electrode body 302, so that the added material becomes chemically incorporated into electrode body 302.

Regardless of how adlayer is applied to electrode body 302, adlayer 304 is non-native to electrode body 302. That is, adlayer 304 introduces at least one other metallic or metal element to electrode body 302. Thus, adlayer 304 is different from a native ionic compound of the electrode body formed by inserting a non-metal into an anionic lattice position via oxidation of the electrode metal. Even if adlayer 304 becomes alloyed with electrode body 302 or only decorate portions the surface of electrode body 302 as discontinuous islands, the added metal may potentially aid in forming an electrically conductive and chemically active adlayer 304.

Adlayer 304 is sufficiently electrically conductive to a permit plasma to be generated nearby. In some embodiments, chemically active adlayer 304 may be formed on an electrically emissive discharge or field generation portion of the electrode.

Figure 4:
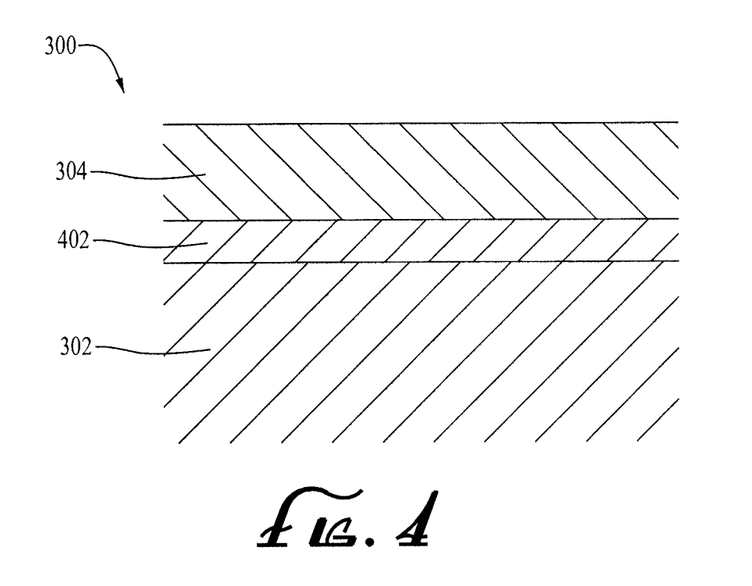
FIG. 4 is a schematic fragmentary view taken at location 4 of the embodiment shown in FIG. 3.

In some embodiments, adlayer 304 may be bonded to electrode body 302 with an adhesion layer. FIG. 4 is a schematic fragmentary view of a cross-section of the embodiment of electrode 300 shown in FIG. 3 taken at location 4. As with FIG. 3, the size and appearance of the layers shown in FIG. 4 are exaggerated for clarity. In the embodiment shown in FIG. 4, adhesion layer 402 is sandwiched between adlayer 304 and electrode body 302 to mechanically and/or chemically bond the adlayer and body together. Using an adhesion layer 402 may prevent delamination of adlayer 304 from electrode body 302 in response to thermal or other stresses during operation. Non-limiting examples of adhesion layer 402 materials may include one or more of titanium (Ti), titanium nitride (TiN), tungsten (W), or chromium (Cr), or in some embodiments consisting essentially of Ti, TiN, W, or Cr.

Figure 5:
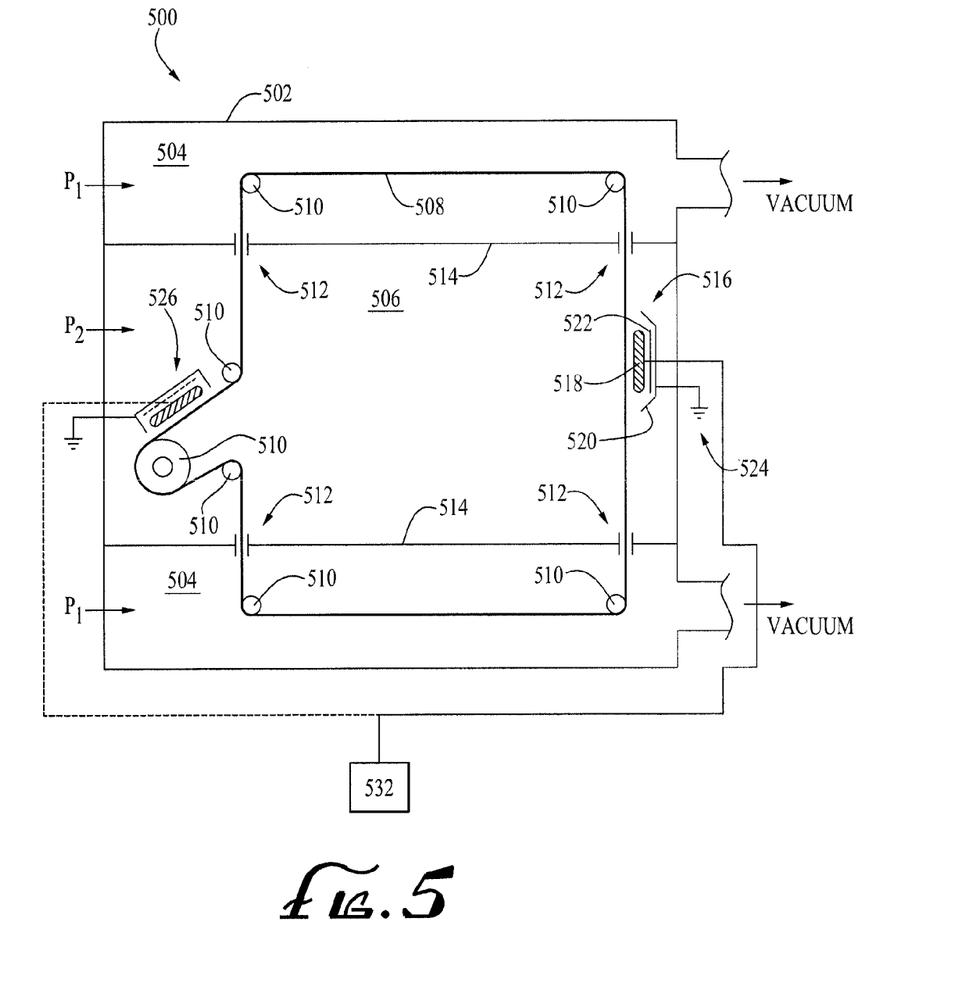
FIG. 5 is a schematic cross-sectional view of an embodiment of a roll-to-roll deposition system.

Embodiments of method 100 and electrode 300 may be employed in embodiments of thin film deposition systems. For example, FIG. 5 is a schematic cross-sectional view of an embodiment of a roll-to-roll deposition system 500 used to perform tests, the results of which are discussed with reference to FIGS. 6, 7, and 8. System 500 is consistent with the systems described in U.S. Pat. No. 8,202,366 B2 of Dickey and Barrow and especially with the system described in FIG. 5 of US Pat. Appl. Pub. 2010/0143710 A1 of Dickey and Barrow.

System 500 includes a reaction space or vessel 502 that includes a pair of precursor zones 504 supplied with a first precursor ($P_1$) and, in between those zones 504, a centrally positioned precursor zone 506 supplied with a second precursor ($P_2$). With reference to FIG. 5 herein, a "loop-mode" configuration wraps a flexible substrate 508, such as a web of plastic film or metal foil, into an endless band (loop), which includes a single path that performs up to two ALD cycles on each revolution as the substrate moves, starting from the leftmost position, from the central precursor zone 506, up into the first precursor zone 504, back down into the central precursor zone 506, down into the second precursor zone 504, and then up to finish back in the central precursor zone 506. As the substrate web 508 travels between zones 504 and 506 it passes through slit valves 512, which are just slots in divider plates 514 that separate the different zones. In this configuration the substrate web 508 can be passed repeatedly through the precursor and isolation zones in a closed loop. (This system is referred to herein as a "roll-to-roll" deposition system, even though the loop substrate configuration used for experimental purposes does not involve transporting the substrate from a feed roll to an uptake roll). In the loop configuration illustrated in FIG. 5, a full traverse of the loop path results in two ALD deposition cycles when two plasma generators 516, 534 are employed in central precursor zone 506. The substrate band is circulated along this loop path X number of times to attain 2X ALD cycles.

System 500 was modified to perform only a single ALD cycle on each revolution of the substrate, as only a single plasma generator was employed and $P_1$ was only supplied to one of precursor zones 504. Plasma generator 516 in FIG. 5 includes a cathode 518 coated by evaporation with different chemically active materials that are described below. Anode 520 (electrically coupled with vessel 502) is shown grounded to earth at 524, while cathode 518 is electrically isolated from vessel 502 by a glass insulator. Cathode 518 is powered by a plasma controller 532 which controls the electrical potential of cathode 518. In turn, a plasma region is generated within a vicinity of substrate 508 and plasma generator 516. While only a single plasma generator was used in the experiments described herein, system 500 includes an optional second plasma generator 526 which may be used to generate a second plasma region within a vicinity of substrate 508 and plasma generator 526.

The experimental test results described in more detail below with reference to FIGS. 6, 7, and 8 were collected under conditions at which $TiO_2$ films (refractive index approximately 2.3) were deposited on flexible substrates (e.g., Melinex® ST-504 PET substrates sold by DuPont Teijin Films). The substrate was pretreated in-situ with an oxygen plasma (1.2 Torr $O_2$, 400 mA plasma current, and 1 lap of travel) prior to deposition. The reactor temperature was about 60 degrees Celsius. The first precursor ($P_1$) was vapor supplied from a titanium tetrachloride ($TiCl_4$) source at room temperature (i.e., about 21 degrees Celsius) and supplied to the lower precursor zone 504 through a 1 mm orifice. The second precursor ($P_2$) was a mixture of carbon dioxide ($CO_2$) and nitrogen ($N_2$) gases supplied at a total supply pressure of about 1.4 Torr. The partial pressure of $CO_2$ was about 0.3 Torr with the balance being nitrogen. Plasma controller 532 includes a DC power supply (specifically a model MDX 500 power supply manufactured by Advanced Energy Industries, Inc. of Fort Collins, Colo.) operated to maintain a constant current of about 140 mA during film deposition.

The cathode was an aluminum (Al) square that had a surface area of approximately 20 square inches ($in^2$) (about 129 square centimeters ($cm^2$)) onto which one of the following adlayer materials was coated prior to testing: Pd, Pt, Co, Ir, Ni, and ITO. The cathodes were prepared by first evaporating approximately 20 nanometers (nm) of a Ti adhesion layer onto the Al electrode body. Second, approximately 200 nm of the desired chemically active adlayer material was evaporated onto the adhesion layer. Third, the cathode was installed in the reactor. The aluminum anode was uncoated in these experiments.

Figure 6:
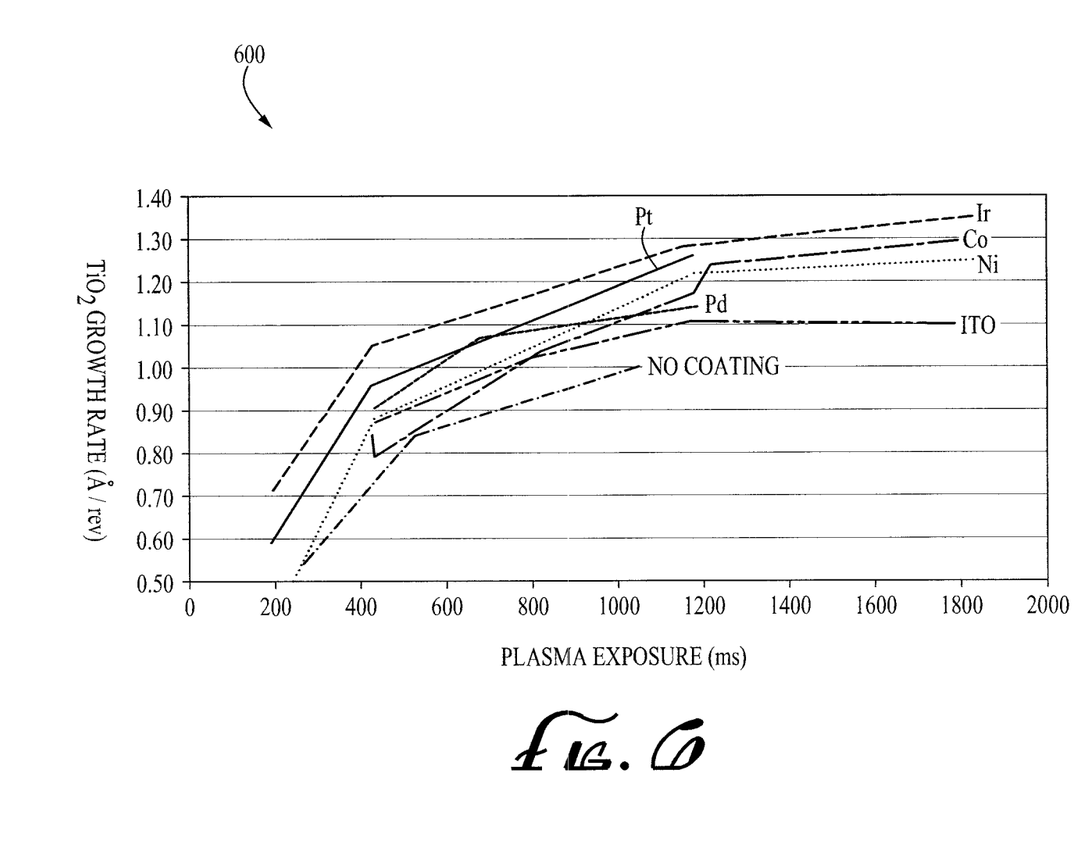
FIG. 6 is a graphical relationship between a duration of a plasma exposure time and deposition rates of $TiO_2$ films formed according to embodiments of the present disclosure.
Figure 7:
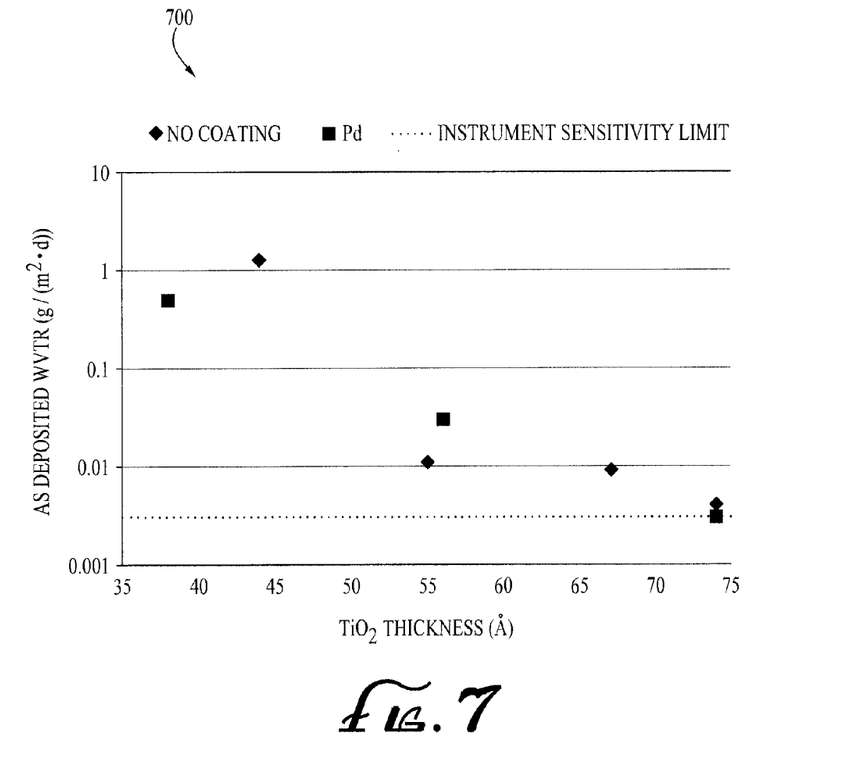
FIG. 7 is a graphical relationship between the thickness of $TiO_2$ films deposited according to embodiments of the present disclosure and the water vapor transmission rate for those films.
Figure 8:
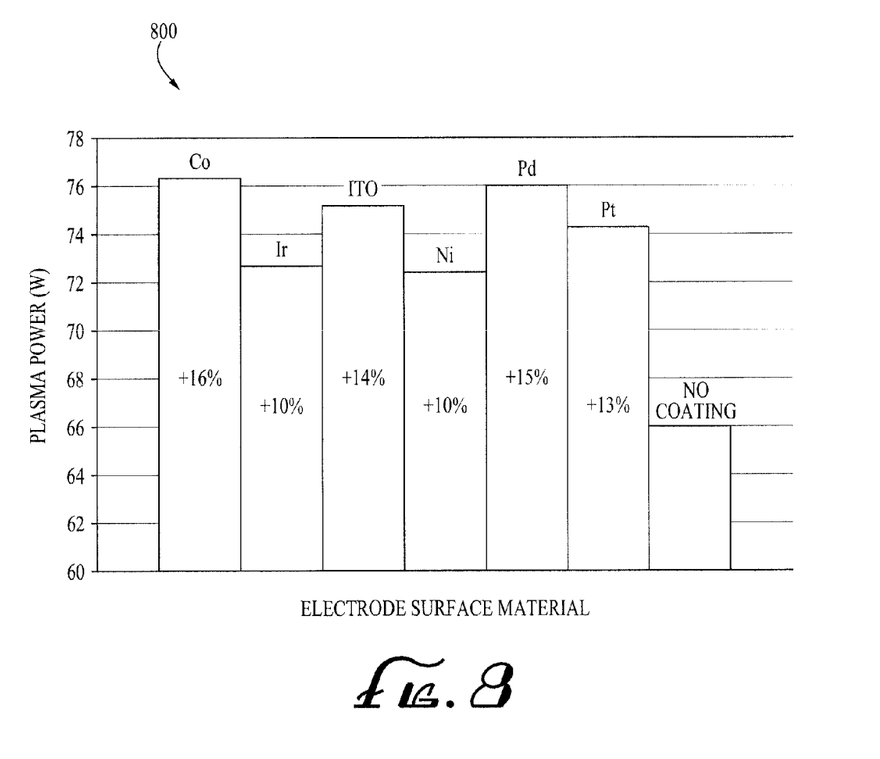
FIG. 8 is a graphical relationship of the average plasma power in watts (W) as a function of the identity of coating materials on embodiments of chemically active cathodes.

FIGS. 6, 7, and 8 illustrate experimental data collected using the modified version of system 500 under the conditions described herein. FIG. 6 is a graphical relationship 600 between the experimental duration of the plasma exposure time in milliseconds (ms), which is directly a function of the band travel speed, and the experimentally determined deposition rate (in Angstroms/complete revolution of the band) of $TiO_2$ films formed according to embodiments of the present disclosure. Relationship 600 illustrates the deposition rate data for each of the different electrode surface materials and for an uncoated control electrode as a collection of marked curves shown in FIG. 6. As the travel speed decreases (shown as an increasing duration of the $CO_2/N_2$ plasma exposure time) the deposition rate plateaus, regardless of the kind of electrode employed. This behavior is believed to be the result of increasing chemisorption and decreasing availability of open surface adsorption sites for the first precursor, indicating the onset of saturation in ALD growth at about 1000 ms. As shown in relationship 600, the performance of the adlayer materials appears to vary with the duration of plasma exposure. For example, Pt and Pd exhibit changes in relative activity before and after the transition to ALD. This may be indicative of the kind of species formed by the different materials. Accelerating the band speed, so that the substrate travels out of the plasma but is still exposed to radicals generated therein, may promote film deposition. In contrast, a slower band speed extends the exposure of the chemisorbed species to the plasma. This may extend the exposure to ions within the plasma, which may degrade or scavenge chemisorbed precursor from the substrate surface, potentially appearing to lower the deposition rate and shift the transition region to ALD to slower speeds, as shown for Pd.

FIG. 6 also shows experimental data demonstrating that each of the adlayer-including cathodes outperforms, in terms of film deposition rate, the control uncoated cathode regardless of the extent to which the substrate is covered with chemisorbed first precursor. Each coated cathode leads to deposition of $TiO_2$ at a faster rate relative to the rate at which $TiO_2$ is deposited using an uncoated control cathode.

It is believed that the resulting films may have superior barrier performance properties (e.g., as water vapor or optical barriers, among other barrier properties). FIG. 7 is a graphical relationship 700 between the thickness of experimental $TiO_2$ films deposited as described herein and the water vapor transmission rate (WVTR) for those films. The WVTR of the coated substrates was measured using a water vapor transmission analyzer (WVTA) model 7001 manufactured by Illinois Instruments, Inc. of Johnsburg, Ill., USA. The $TiO_2$-coated PET substrates were clamped in a diffusion chamber of the model 7001 WVTA, which measures WVTR by subjecting the coated substrates to test and carrier gases that attempt to permeate the sample. The 7001 WVTA conforms to ISO 15105-2 and uses a modified ASTM standard that conforms to ISO 15106-3. WVTA measurements were conducted at 37.8 degrees Celsius with a relative humidity of 90%. The 7001 WVTA has a lower sensitivity limit of 0.003 $g/m^2/day$, which is illustrated as a dotted line on FIG. 7. Relationship 700 compares films prepared using an example Pd adlayer-including cathode (WVTR data illustrated with square-shaped markers in FIG. 7) and an uncoated cathode (WVTR data illustrated with diamond-shaped markers in FIG. 7), and demonstrates that, for a given thickness, the films exhibit comparable performance. Because the adlayer-including cathodes deposit film faster than the uncoated cathodes, it is expected that substrates may be coated with higher throughput without compromising water vapor barrier performance.

It is contemplated that many of the chemically active materials described herein as being added to electrode surfaces will have different work functions or secondary electron emission characteristics from the underlying electrode body and/or adhesion layer materials. These differences may alter the plasma impedance. For example, higher impedance may allow a higher operating voltage for the plasma, potentially preventing plasma breakdown at that voltage. Lower impedance may allow higher plasma current for a given power. In some embodiments, an Al or an Al-containing conductive adlayer applied to a Co, Ni, Pd, Pt, or other electrode emissive body material may lower the plasma impedance of the electrode.

In the tests described above, the plasma current was maintained at about 140 mA during film deposition. Average plasma operating power readings were recorded during each experimental test. FIG. 8 is a graphical relationship 800 of the average plasma power (in watts) as a function of the adlayer material identity. As a baseline, the uncoated control cathode typically operated at about 66 W. Each of the adlayers tested increased the plasma power consumption by between about 10% and 16%, indicating an increase in plasma impedance.

Figure 9:
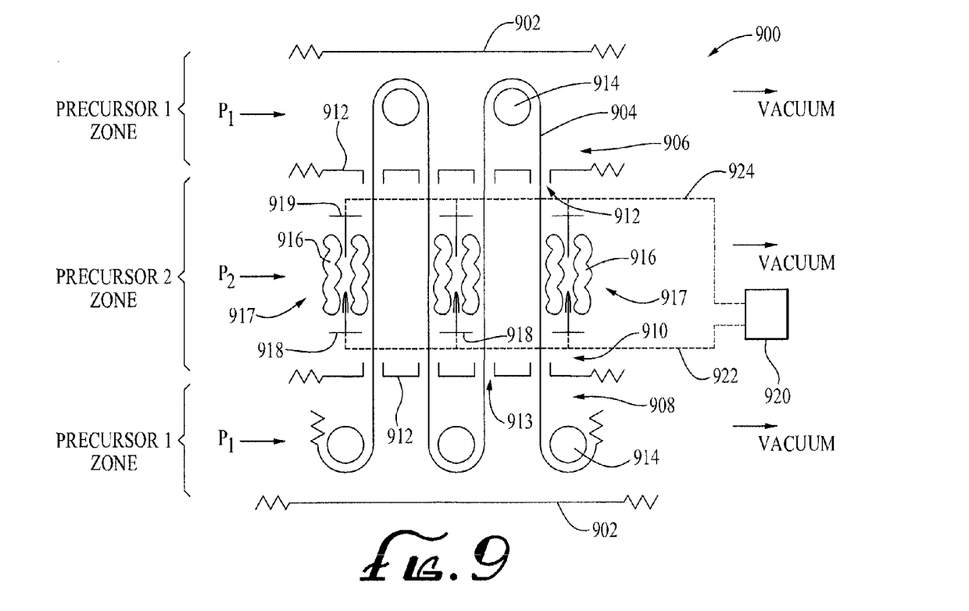
FIG. 9 is a schematic, fragmentary cross-sectional view of an embodiment of a thin film deposition system.

FIG. 9 is a schematic, fragmentary cross-sectional view of an embodiment of a thin film deposition system 900 for coating, in a process space or vessel 902, a flexible substrate 904 (shown in profile in FIG. 9) with a flexible layer of material via ALD. In the embodiment shown in FIG. 9, thin film deposition system 900 includes first, second, and third precursor zones 906, 908, and 910, respectively, that are supplied with two different precursor gases $P_1$ and $P_2$ (shown as Precursor 1 Zone and Precursor 2 Zone in FIG. 9). Because the precursor gases may be sensitive or chemically reactive with one another in some embodiments, isolation zones (not shown) may separate adjacent precursor zones from one another as described in U.S. Pat. No. 8,202,366 B2 of Dickey and Barrow. In the embodiment shown in FIG. 9, the process environment is defined and bounded by process vessel 902, which separates the process environment from the external ambient environment. Vessel 902 may comprise a pressure vessel and/or a vacuum vessel. In the embodiment shown in FIG. 9, vessel 902 fluidly communicates with a pump/suction source (not shown) so that the process environment may be adjustably controlled to and maintained at a subatmospheric pressure.

The process environment may also be subdivided into two or more subchambers. In the embodiment shown in FIG. 9, precursor zones 906, 908, and 910 are separated from one another by zone dividers 912, In some other embodiments, additional zone dividers may separate the precursor zones and any isolation zones from one or more antechambers, such as a pre-deposition subchamber and/or a post-deposition subchamber (not shown). A series of passageways 913 through zone dividers 912 are spaced apart along a general direction of travel of substrate 904, and are arranged and configured so that substrate 904 traverses a pathway passing back and forth between first, second, and third precursor zones 906, 908, and 910, multiple times, in some embodiments passing through an isolation zone in between each passage through a particular precursor zone. Turning guides 914 direct substrate 904 back in an opposite direction so that substrate 904 is transported back and forth between the precursor zones (e.g., Precursor 1 Zone→Precursor 2 Zone→Precursor 1 Zone→Precursor 2 Zone→ . . . ). While the embodiment shown in FIG. 9 includes three precursor zones, it will be appreciated that some embodiments may include four or more precursor zones, and that some other embodiments may have fewer than three precursor zones.

In the embodiment shown in FIG. 9, plasma regions 916 are generated by a plurality of plasma generators 917 positioned within third precursor zone 910, though it will be appreciated that plasma generators 917 may be located in any of the precursor zones 906, 908, and 910. During use, plasma generators 917 generate plasma regions 916 primarily in an area where a field is applied by plasma generator 917 when a plasma sensitive process gas is supplied within third precursor zone 910. In some embodiments, plasma region 916 may extend toward the pathway so that the plasma gas contacts one or both surfaces of flexible substrate 904, permitting plasma generation to occur proximal to the exposed surface of substrate 904. It will be appreciated that the shape and size of plasma region 916 may be affected by plasma generator power conditions, total and partial pressure conditions near plasma generators 917, and/or sizes and locations of plasma generators 917. Thus, in some embodiments, two or more plasma generators 917 may contribute to and be enveloped by a common plasma region 916, even though the plasma regions 916 depicted in FIG. 9 appear discrete and separate.

Each of the plasma generators 917 shown in FIG. 9 includes a first electrode 918 having a non-native electrically conductive electrode surface (e.g., including an embodiment of an adlayer like those described herein) that exhibits property characteristics that cause the electrode surface to be substantially conserved and chemically active with at least one of the gases present within the plasma generation region during plasma generation, and a second, complementary electrode 919. First and second electrodes 918 and 919 are electrically insulated from one another by a space separating the electrodes at plasma region 916 and by suitable electrical insulators elsewhere (not shown). The plurality of plasma generators 917 shown in FIG. 9 are powered by a common power supply 920, though in some embodiments groups and/ or individual plasma generators 917 may be powered by separate power supplies so that corresponding plasma regions 916 may be separately controlled (e.g., to provide zone control of plasma regions 916). In some embodiments, power supply 920 may include a DC power supply for generating a glow discharge plasma. In some other embodiments power supply 920 may include a radio frequency (RF) generator and a capacitance matching network for generating a capacitively coupled plasma.

In the embodiment shown in FIG. 9, all first electrodes 918 are in electrical communication with one another and with a first pole of power supply 920 via a first electrode bus 922, so that all first electrodes 918 may have the same electrical potential, within an acceptable tolerance. Likewise, all second electrodes 919 are in electrical communication with one another and with a different pole of power supply 920 via a second electrode bus 924 in the embodiment shown in FIG. 9. For example, in embodiments where power supply 920 includes a DC power supply, connecting first electrodes 918 with a negative pole of power supply 920 and second electrodes 919 with a positive pole of power supply 920 will cause first electrodes 918 to act as cathodes and second electrodes 919 to act as anodes.

Figure 10:
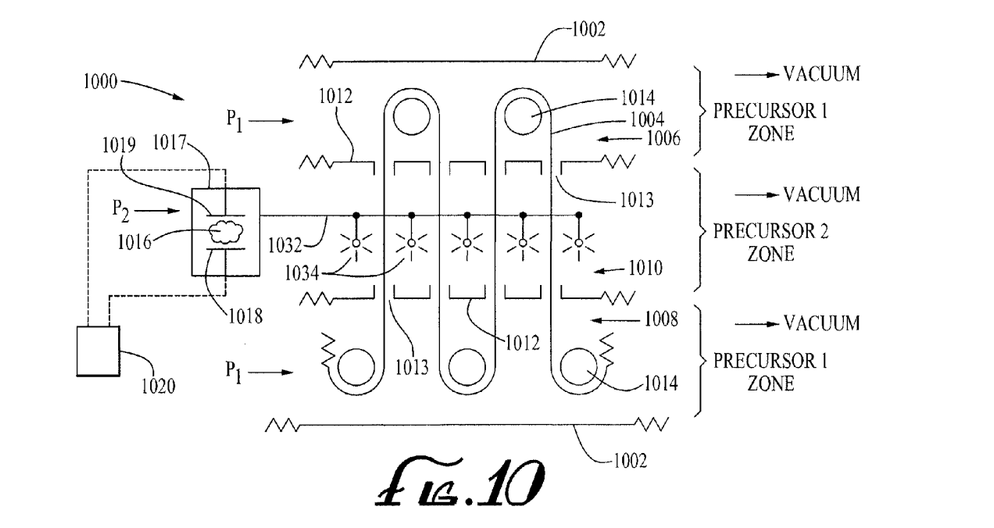
FIG. 10 is a schematic, fragmentary cross-sectional view of another embodiment of a thin film deposition system.

FIG. 10 is a schematic, fragmentary cross-sectional illustration of another embodiment of a thin film deposition system 1000. In FIG. 10, the reference numbers having the same final two digits as FIG. 9, as preceded by the number "10," identify analogous structures. For example, reference number 1002 in FIG. 10 identifies a process space or vessel analogous to process space or vessel 902 in FIG. 9. In the embodiment shown in FIG. 10, a plasma region 1016 is generated from a second precursor using single remote plasma generator 1017. Radicals formed within plasma 1016 are distributed via a radical delivery conduit 1032 to outlets 1034 within precursor zone 1010, where they interact with chemisorbed precursor $P_1^*$ on substrate 1004.

It will be obvious to those having skill in the art that many changes may be made to the details of the above-described embodiments without departing from the underlying principles of the invention. The scope of the present invention should, therefore, be determined only by the following claims.

The invention claimed is:

1. A system for forming a thin film on a substrate using a plasma to activate film deposition process from at least one gaseous precursor, the system comprising:
    a reaction space which is, when the system is in use, supplied with a precursor gas and provisioned with the substrate; and
    a plasma generator fluidly coupled with the reaction space and operative to generate in a plasma generation region a plasma from at least a portion of the precursor gas and having at least one plasma electrode including a non-native electrically conductive adlayer exhibiting property characteristics that cause the adlayer to be substantially conserved and chemically active with at least one of the gases present within the plasma generation region.

2. The system of claim 1, further comprising another plasma electrode that is electrically insulated from the at least one plasma electrode and electrically operative to have a different electrical potential from the at least one plasma electrode.

3. The system of claim 2, wherein the other plasma electrode includes one or more of a dark space shield fluidly coupled with the plasma generation region or a reaction vessel wall fluidly coupled with the plasma generation region.

4. The system of claim 2, wherein the other plasma electrode does not include a non-native electrically conductive adlayer.

5. The system of claim 1, wherein the selected plasma electrode includes an electrode body which supports the adlayer, wherein the electrode body is formed from a first metal, and wherein the adlayer includes a second metal that is different from the first metal.

6. The system of claim 5, wherein a work function of the second metal is different from a work function of the first metal.

7. The system of claim 1, wherein the adlayer consists essentially of a transition metal selected from the group consisting of palladium (Pd), platinum (Pt), cobalt (Co), iridium (Ir), and nickel (Ni).

8. The system of claim 1, wherein the adlayer includes a conductive layer formed by partial reduction of a stable oxide.

9. The system of claim 8, wherein the adlayer includes a reduced mixed oxide including indium and tin.

10. The system of claim 1, wherein the plasma electrode includes an electrode body, and wherein an adhesion layer covers at least a portion of the electrode body to thereby bond the adlayer to the electrode body.

11. The system of claim 10, wherein the adhesion layer includes one or more of titanium (Ti), titanium nitride (TiN), chromium (Cr), or tungsten (W).

12. The system of claim 1, wherein the selected plasma electrode is a cathode.

13. The system of claim 1, wherein the plasma generator is positioned within the reaction space.

14. The system of claim 1, wherein the plasma generator is fluidly coupled with the reaction space via a radical delivery conduit.

15. The system of claim 1, wherein the adlayer includes, in an amount of about 15% or less, a p-type dopant selected from the group consisting of fluorine (F), antimony (Sb), and aluminum (Al).

16. The system of claim 1, wherein the substrate is a flexible substrate and wherein the plasma supplies radicals generated from the precursor gas to a first precursor zone, thereby forming chemisorbed first precursor on the substrate, and further comprising a second precursor zone separated from the first precursor zone by a zone divider, the second precursor zone supplied with a second precursor that is reactive with the chemisorbed first precursor; and
    a transport mechanism adapted to impart relative motion between the flexible substrate and the first and second precursor zones so as to alternate exposure of the flexible substrate to the first and second precursor zones and build up a film on the flexible substrate.

17. A method of depositing a thin film on a substrate, the method comprising:
    provisioning a reaction space with a substrate;
    forming a layer of a first precursor on an active region of the substrate;
    removing non-chemisorbed amounts of the first precursor from the layer until no more than chemisorbed first precursor remains on the active region;
    supplying, with a second precursor gas, a plasma generator having a plasma electrode including a non-native electrically conductive adlayer exposed to the second precursor gas, the adlayer exhibiting property characteristics that cause the non-native electrically conductive adlayer to be substantially conserved and chemically active with the second precursor gas present within the plasma generator;
    using the plasma generator, generating a plasma using at least a portion of the second precursor gas to thereby form radicals from the second precursor gas; and
    after removing non-chemisorbed amounts of the first precursor from the active region, exposing the active region to the radicals to thereby form a thin film on the substrate.

18. The method of claim 17, wherein the plasma electrode is one of at least one pair of plasma electrodes operable at different electrical potentials to generate the plasma.

19. The method of claim 17, further comprising:
    supplying the first precursor gas within a first precursor zone;
    supplying the second precursor gas within a second precursor zone; and
    using a substrate transport mechanism, imparting relative motion between the substrate and the first and second precursor zones.

20. The method of claim 17, wherein the plasma electrode includes an electrode body which supports the adlayer, wherein the electrode body is formed from a first metal, and wherein the adlayer includes a second metal that is different from the first metal.

21. The method of claim 20, wherein a work function of the second metal is different from a work function of the first metal.

22. The method of claim 17, further comprising positioning the plasma generator within the reaction space.

23. The system of claim 17, further comprising fluidly coupling the plasma generator with the reaction space via a radical delivery conduit so that the active region is not exposed to plasma.

24. The method of claim 17, wherein generating the plasma includes catalytically transforming the second precursor gas into radicals using the plasma electrode.

25. The method of claim 17, wherein the non-native electrically conductive adlayer is chemically active with the second precursor gas to substantially maintain the electrical conductivity of the electrode.

26. A system for forming a thin film on a substrate using a plasma to activate a film deposition process from at least one gaseous precursor, the system comprising:

means for forming a layer of a first precursor on an active region of the substrate;
  means for removing non-chemisorbed amounts of the first precursor from the layer until no more than chemisorbed first precursor remains on the active region;
  means for supplying a plasma generator with a second precursor gas, the plasma generator having a plasma electrode including a non-native electrically conductive adlayer exposed to a second precursor gas, the adlayer exhibiting property characteristics that cause the non-native electrically conductive adlayer to be substantially conserved and chemically active with the second precursor gas present within the plasma generator to thereby form radicals from the second precursor gas; and
  means for exposing the active region to the radicals after the non-chemisorbed amounts of the first precursor have been removed from the active region, to thereby form a thin film on the substrate.

27. The method of claim 26, wherein the non-native electrically conductive adlayer catalytically transforms the second precursor gas into radicals.

28. The method of claim 26, wherein the non-native electrically conductive adlayer substantially maintains the electrical conductivity of the plasma electrode.

29. The method of claim 26, wherein the non-native electrically conductive adlayer has a different work function than the plasma electrode.

* * * * *